(12) United States Patent
Xiong et al.

(10) Patent No.: US 10,354,567 B2
(45) Date of Patent: Jul. 16, 2019

(54) CELL TEST METHOD AND CELL TEST DEVICE

(71) Applicant: WUHAN CHINA STAR OPTOELECTRONICS TECHNOLOGY CO., LTD., Wuhan, Hubei (CN)

(72) Inventors: Bin Xiong, Hubei (CN); Yingchi Wang, Hubei (CN); Chunhung Huang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 210 days.

(21) Appl. No.: 15/320,764

(22) PCT Filed: Jul. 11, 2016

(86) PCT No.: PCT/CN2016/089627
§ 371 (c)(1),
(2) Date: Dec. 21, 2016

(87) PCT Pub. No.: WO2017/161781
PCT Pub. Date: Sep. 28, 2017

(65) Prior Publication Data
US 2018/0061289 A1    Mar. 1, 2018

(51) Int. Cl.
*G09G 3/00* (2006.01)
*H01L 21/66* (2006.01)
*G02F 1/133* (2006.01)
*G01R 31/00* (2006.01)
*G02F 1/13* (2006.01)
(Continued)

(52) U.S. Cl.
CPC .............. *G09G 3/006* (2013.01); *G01R 31/00* (2013.01); *G02F 1/133* (2013.01); *G02F 1/1309* (2013.01); *G02F 1/13306* (2013.01); *G02F 1/13338* (2013.01); *G06F 3/0412* (2013.01); *H01L 22/32* (2013.01); *G09G 3/3225* (2013.01); *G09G 3/3648* (2013.01)

(58) Field of Classification Search
CPC ..... G09G 3/006; H01L 22/32; G02F 1/13338; G02F 1/1309; G02F 1/133
See application file for complete search history.

(56) References Cited

U.S. PATENT DOCUMENTS 6,603,467 B1 * 8/2003 Wu .................. H05K 3/243
204/403.01
2015/0366049 A1 * 12/2015 Lee ................. G02F 1/13458
361/749
2018/0018910 A1 * 1/2018 Jang .................. G09G 3/006

* cited by examiner

Primary Examiner — Selim U Ahmed
Assistant Examiner — Evan G Clinton
(74) Attorney, Agent, or Firm — Mark M. Friedman

(57) ABSTRACT

A cell test method used for a fanout zone of a step location of a liquid crystal displays panel or an organic light emitting display panel, comprising the following steps:
  adding a cell test pad on an edge of a semi-finished flexible printed circuit board on glass (FOG) for the cell test method if length of the edge of the semi-finished FOG is greater than a critical value;
  placing alignment marks on the cell test pad;
  aligning the cell test pad by using the charge-coupled device;
  multiplexing process of some pins of the flexible printed circuit board to send signals for a cell test if the length of an edge of the semi-finished FOG is less than the critical value, controlling the signals to turn on by a metal oxide semiconductor.

12 Claims, 3 Drawing Sheets

(51) Int. Cl.
  *G02F 1/1333* (2006.01)
  *G06F 3/041* (2006.01)
  *G09G 3/36* (2006.01)
  *G09G 3/3225* (2016.01)

CELL TEST METHOD AND CELL TEST DEVICE

BACKGROUND OF THE INVENTION

1. Field of the Invention

The present disclosure relates to the field of liquid crystal displays (LCD), and more particularly to a cell test method and a cell test device for an LCD panel or an organic light emitting display (OLED) panel.

2. Description of the Prior Art

In manufacturing a liquid crystal display (LCD), product quality needs to be continually monitored, and unqualified products are timely removed, which improves a qualification rate of the products. Issues and existing risk may appear in the manufacturing according to the monitoring. At present, a cell test is performed on a panel before a display driver integrated circuit (IC) and a touch controller IC are bonded. As long as display of the panel is normal, the display driver integrated circuit (DDIC) and a digital diagnosis IC are bonded next. Furthermore, the entire display and other criteria need to be tested until product quality meets client requirements.

At present, cutting a step location of an LCD panel involves making a right-angle cut, therefore, step zone of a thin film transistor (TFT) cannot only put wires of a fanout zone but also put the panel for a cell test. As shown in FIG. 1, the panel includes a test pad 10 and the display driver integrated circuit 11. A relative signal is sent, and the panel can display some patterns without the display driver integrated circuit, which avoids unqualified products from entering a next step. As technology continues to improve, customers are placing more emphasis on size, light, and thickness of the products, which makes panel companies try to improve technology, such as further decreasing thickness of glasses; however, this causes strength of the glasses to be correspondingly decreased. In addition, a traditional backlight basic is a plastic element, and edge of the traditional backlight and an edge of the panel are substantially in alignment, which causes the glasses without cushion protection. As requirement of processing for bonding IC and a flexible printed circuit board, a polaroid cannot be attached to the panel, a step location for attaching the panel and a chip on film panel is weakness, namely wires for bonding the IC, the flexible printed circuit board, a wire on array and the fanout zone are weakness. With improvement of touch technology, more and more panel companies are constantly researching new technology that puts touch integration into their own products, which improves integration and customer experience, which further saves manufacturing cost, and package and transportation cost. Based on the above reason, some panel companies use oblique cut method at the step location of the TFT. In addition, even if the touch integration of the panel is used, quality of the products still needs to be tested. Therefore, wires of the fanout zone of the step location of the panel is dense to cause that the cell test pad cannot be put in a certain place, and the above problem needs to be solved.

SUMMARY OF THE INVENTION

The aim of the present disclosure is to provide a cell test method to solve problem that a cell test pad cannot be put in a certain place.

In order to achieve the aim of the present disclosure, the present disclosure provides the cell test method, where the cell test method comprises the following steps:

adding a cell test pad on an edge of a flexible printed circuit board on glass (FOG) connected to semi-finished FOG for the cell test method if length of the edge of the semi-finished FOG is greater than a critical value;

placing alignment marks on the cell test pad;

aligning the cell test pad by using the charge-coupled device;

multiplexing process of some pins of the flexible printed circuit board to send signals for a cell test if the length of an edge of the semi-finished FOG is less than the critical value, controlling the signals to turn on by metal oxide semiconductor.

Furthermore, the multiplexing process comprises the following steps:

pulling out a wire from the some pins of the flexible printed circuit board;

placing a thin film transistor (TFT) made of the metal oxide semiconductor on the wire and controlling turning-on of the signals by the TFT.

Furthermore, a gate electrode of the TFT is connected to a TFT turn-on voltage or a TFT turn-off voltage. A source electrode of the TFT and a drain electrode of the TFT are connected to cell test signals detected the semi-finished FOG and the some pins of the flexible printed circuit board, respectively.

Furthermore, when a cell test is performed, a gate electrode of the TFT is turned on. When the cell test is not performed, the gate electrode of the TFT is turned off.

The embodiment of the present disclosure provides a cell test device, where the cell test device comprises: a semi-finished flexible printed circuit board on glass (FOG), a flexible printed circuit board used for cell test, and a charge-coupled device used for counterpoint of the cell test pad. The signals are sent in the cell test by multiplexing process of some pins of the flexible printed circuit board, and turning-on of the signals is controlled by metal oxide semiconductor.

Furthermore, when cell test device is multiplexed, the multiplexed cell test device comprises: a wire pulled out from the some pins of the flexible printed circuit board, and a thin film transistor (TFT) made of metal oxide semiconductor placed on the wire for controlling the turning-on of the signals.

Furthermore, a gate electrode of the TFT is connected to a TFT turn-on voltage or a TFT turn-off voltage. A source electrode of the TFT and a drain electrode of the TFT are connected to cell test signals detected the semi-finished FOG and the some pins of the flexible printed circuit board, respectively.

Furthermore, the cell test is performed, a gate electrode of the TFT is turned on; when the cell test is not performed, the gate electrode of the TFT is turned off.

The embodiment of the present disclosure provides further provides a liquid crystal display (LCD) panel, where the LCD panel comprises the above cell test device.

The present disclosure solves the problem that the cell test pad cannot be put in a certain place, which is beneficial to control quality of the products and automatically test the panel.

DETAILED DESCRIPTION OF THE PREFERRED EMBODIMENTS

The following description of every embodiment with reference to the accompanying drawings is used to exemplify a specific embodiment, which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention.

Figure 1:
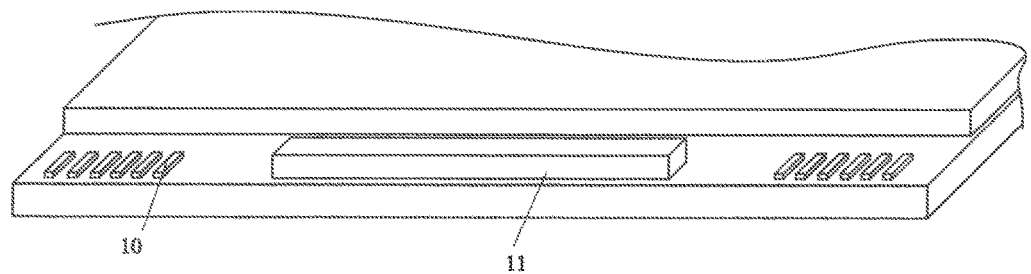
FIG. 1 is a schematic diagram of placement of a cell test pad of the prior art.
Figure 2:
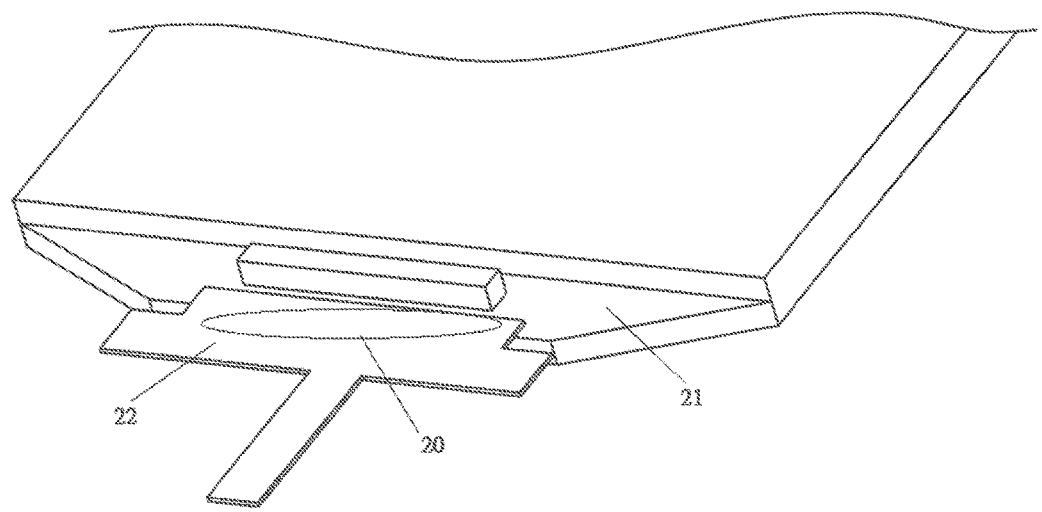
FIG. 2 is a schematic diagram of a oblique cut of a thin film transistor of the prior art.
Figure 3:
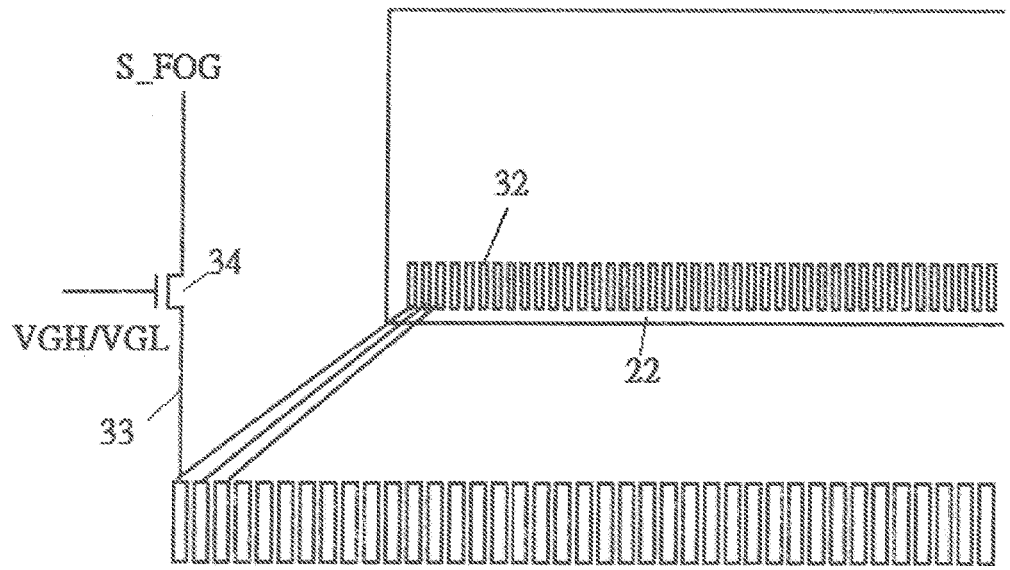
FIG. 3 is a schematic diagram of multiplexing of a semi-finished flexible printed circuit board on glass (FOG) of an embodiment of the present disclosure.

As shown in FIG. 2 and FIG. 3, FIG. 2 is a schematic diagram of an oblique cut of a thin film transistor (TFT) of the prior art, and FIG. 3 is a schematic diagram of multiplexing of a semi-finished flexible printed circuit board on glass (FOG) of an embodiment of the present disclosure. In FIG. 2, when a panel is cut irregularly, area of zone 20 is limited, and placement of a cell test pad is limited. In other words, when a glass 21 is obliquely cut, the zone 20 that places the cell test pad largely decreases. Based on the above problem, the present disclosure shares some pins of the semi-finished flexible printed circuit board on glass (FOG), and uses a cell test method of the flexible printed circuit board 22 to detect quality of the products.

Figure 4:
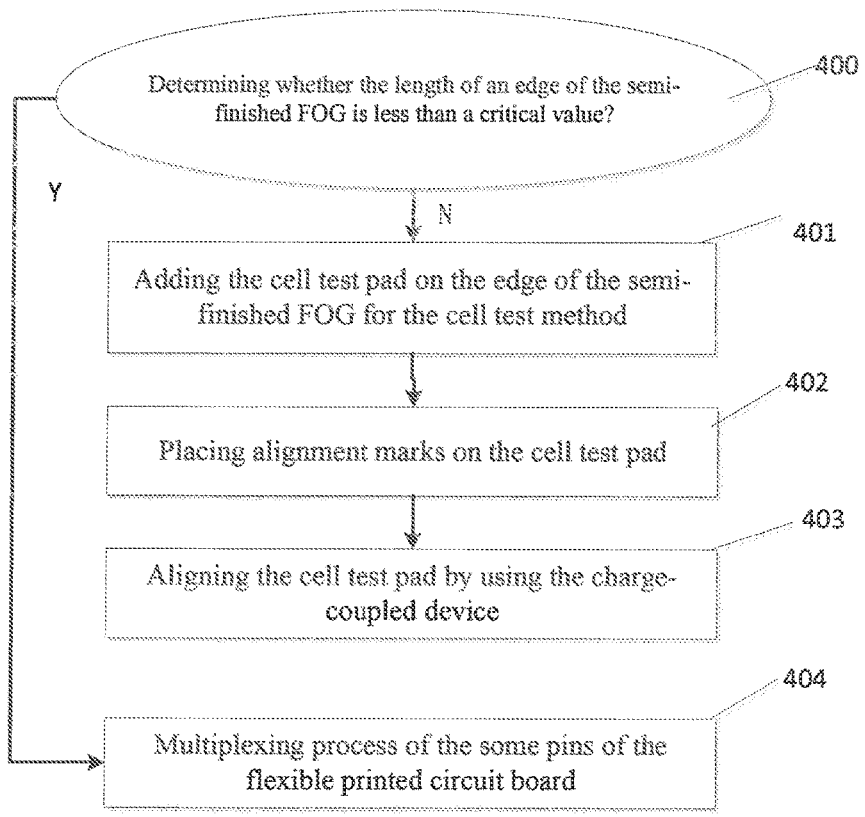
FIG. 4 is a flowchart of a cell test method of FIG. 3.

As shown in FIG. 3, when the length of an edge of the semi-finished FOG is allowable, the edge of the semi-finished FOG add the cell test pad 30 that is needed by the cell test. In order to use a charge-coupled device to align, alignment marks are placed on the added cell test pad 30, which makes for more accurate alignment of the cell test pad 30. In addition, when the length of an edge of the semi-finished FOG is not allowable, some pins 32 of the flexible printed circuit board 22 can be multiplexed. One specific method is that a wire 33 pulled out is connected to the some pins 32 of the flexible printed circuit board 22, and a thin film transistor (TFT) 34 (N-type TFT or a P-type TFT) is placed on the wire 33, where a gate electrode of the TFT 34 is connected to a turn-on voltage VGH or a turn-off voltage VGL. A source electrode of the TFT 34 and a drain electrode of the TFT 34 are connected to cell test signals S_FOG detected the semi-finished FOG and the some pins of the flexible printed circuit board 22, respectively. The TFT 34 is made of metal oxide semiconductor. When the cell test is performed, the gate electrode of the TFT 34 is turned on, and an integrated circuit is not bonded, therefore, the cell test signals S_FOG is not input to the integrated circuit. When the cell test is not performed, the gate electrode of the TFT 34 is turned off, a path of the cell test is turned off. When the integrated circuit is bonded, required signals are input to the semi-finished FOG As shown in FIG. 4, FIG. 4 is a flowchart of a cell test method of FIG. 3. The cell test method comprises the following steps:

S400: determining whether the length of an edge of the semi-finished FOG is less than a critical value, if the length of an edge of the semi-finished FOG is less than the critical value, S404 is performed, if the length of an edge of the semi-finished FOG is greater than or equal to the critical value, S401 is performed;

S401: adding the cell test pad 30 on the edge of the semi-finished FOG for the cell test method;

S402: placing alignment marks on the cell test pad;

S403: aligning the cell test pad by using the charge-coupled device;

S404: multiplexing process of the some pins of the flexible printed circuit board.

The critical value is defined according to size of the tested panel. Generally speaking, the critical value is proportional to the size of the tested panel.

Figure 5:
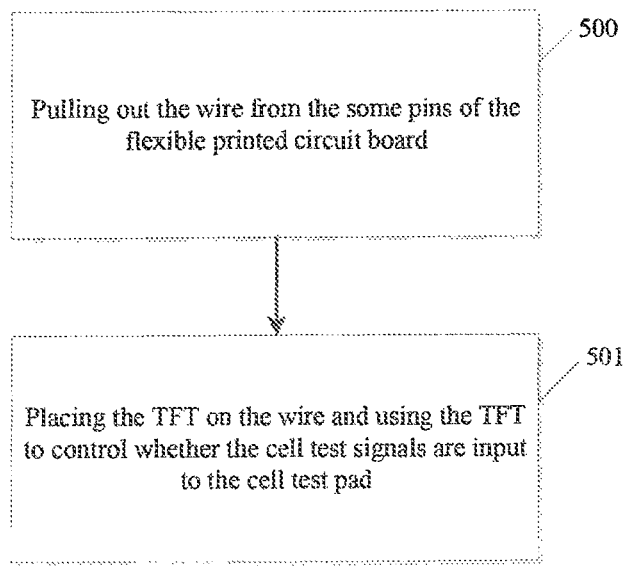
FIG. 5 is a flowchart of a multiplexing method of the embodiment of the present disclosure.

As shown in FIG. 5, FIG. 5 is a flowchart of a multiplexing method of the embodiment of the present disclosure. The multiplexing process comprises the follow steps:

S500: pulling out the wire from the some pins of the flexible printed circuit board;

S501: placing the TFT on the wire and using the TFT to control whether the cell test signals are input to the cell test pad.

The present disclosure solves the problem that the cell test pad cannot be put in a certain place, which is beneficial to control quality of the products and automatically test the panel.

It should be understood that the present disclosure has been described with reference to certain preferred and alternative embodiments which are intended to be exemplary only and do not limit the full scope of the present disclosure as set fourth in the appended claims.

What is claimed is:

1. A cell test method, comprising the following steps:
   adding a cell test pad on an edge of a semi-finished flexible printed circuit board on glass (FOG) if length of the edge of the semi-finished FOG is greater than a critical value;
   placing alignment marks on the cell test pad;
   aligning the cell test pad by using a charge-coupled device;
   multiplexing process of some pins of the flexible printed circuit board to send signals for a cell test if the length of an edge of the semi-finished FOG is less than the critical value, and controlling the signals to turn on by a metal oxide semiconductor.

2. The cell test method as claimed in claim 1, wherein the multiplexing process comprises the following steps:
   pulling out a wire from the some pins of the flexible printed circuit board;
   placing a thin film transistor (TFT) made of the metal oxide semiconductor on the wire and controlling turning-on of the signals by the TFT.

3. The cell test method as claimed in claim 2, wherein a gate electrode of the TFT is connected to a TFT turn-on voltage or a TFT turn-off voltage, a source electrode of the TFT and a drain electrode of the TFT are connected to cell test signals detected the semi-finished FOG and the some pins of the flexible printed circuit board, respectively.

4. The cell test method as claimed in claim 2, when a cell test is performed, a gate electrode of the TFT is turned on; when the cell test is not performed, the gate electrode of the TFT is turned off.

5. A cell test device, comprising:
   a semi-finished flexible printed circuit board on glass (FOG);
   a flexible printed circuit board used for a cell test; and
   a charge-coupled device used for alignment of a cell test pad;
   wherein signals are sent in the cell test by multiplexing process of some pins of the flexible printed circuit board, and turning-on of the signals is controlled by a metal oxide semiconductor if the length of an edge of the semi-finished FOG is less than a critical value, and controlling the signals to turn on by a metal oxide semiconductor.

6. The cell test device as claimed in claim 5, when the cell test device is multiplexed, the multiplexed cell test device comprises:
   a wire pulled out from the some pins of the flexible printed circuit board; and
   a thin film transistor (TFT) made of metal oxide semiconductor placed on the wire for controlling the turning-on of the signals.

7. The cell test device as claimed in claim 6, wherein a gate electrode of the TFT is connected to a TFT turn-on voltage or a TFT turn-off voltage; a source electrode of the TFT and a drain electrode of the TFT are connected to cell test signals detected the semi-finished FOG and the some pins of the flexible printed circuit board, respectively.

8. The cell test device as claimed in claim 6, wherein the cell test is performed, a gate electrode of the TFT is turned on; when the cell test is not performed, the gate electrode of the TFT is turned off.

9. A cell test method, comprising the following steps:
   multiplexing process of some pins of the flexible printed circuit board to send signals for a cell test if the length of an edge of the semi-finished FOG is less than a critical value, and controlling the signals to turn on by a metal oxide semiconductor.

10. The cell test method as claimed in claim 9, wherein the multiplexing process comprises the following steps:
    pulling out a wire from the some pins of the flexible printed circuit board;
    placing a thin film transistor (TFT) made of the metal oxide semiconductor on the wire and controlling turning-on of the signals by the TFT.

11. The cell test method as claimed in claim 10, wherein a gate electrode of the TFT is connected to a TFT turn-on voltage or a TFT turn-off voltage, a source electrode of the TFT and a drain electrode of the TFT are connected to cell test signals detected the semi-finished FOG and the some pins of the flexible printed circuit board, respectively.

12. The cell test method as claimed in claim 10, when a cell test is performed, a gate electrode of the TFT is turned on; when the cell test is not performed, the gate electrode of the TFT is turned off.

* * * * *

UNITED STATES PATENT AND TRADEMARK OFFICE
CERTIFICATE OF CORRECTION

PATENT NO. : 10,354,567 B2  
APPLICATION NO. : 15/320764  
DATED : July 16, 2019  
INVENTOR(S) : Bin Xiong Page 1 of 1

It is certified that error appears in the above-identified patent and that said Letters Patent is hereby corrected as shown below:

On the Title Page

Item (30) Foreign Application Priority Data:  
Please insert, -- March 23, 2016 (CN) 201610168070.7 --

Signed and Sealed this  
Third Day of September, 2019

Andrei Iancu  
*Director of the United States Patent and Trademark Office*